United States Patent
Park

(10) Patent No.: US 9,312,305 B2
(45) Date of Patent: Apr. 12, 2016

(54) PHASE-CHANGE MEMORY DEVICE HAVING MULTIPLE DIODES

(71) Applicant: SK hynix Inc., Gyeonggi-do (KR)

(72) Inventor: Hae Chan Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/242,490

(22) Filed: Apr. 1, 2014

(65) Prior Publication Data

US 2014/0209847 A1    Jul. 31, 2014

Related U.S. Application Data

(62) Division of application No. 13/753,610, filed on Jan. 30, 2013, now Pat. No. 8,710,480, which is a division of application No. 12/976,676, filed on Dec. 22, 2010, now Pat. No. 8,384,057.

(30) Foreign Application Priority Data

Jul. 6, 2010  (KR) .................. 10-2010-0064866

(51) Int. Cl.
*H01L 27/24* (2006.01)
*H01L 29/861* (2006.01)
*H01L 45/00* (2006.01)

(52) U.S. Cl.
CPC .......... *H01L 27/2409* (2013.01); *H01L 29/861* (2013.01); *H01L 45/06* (2013.01)

(58) Field of Classification Search
CPC ................................................ H01L 27/2409
USPC .................................... 257/2–4, 77
See application file for complete search history.

(56) References Cited

U.S. PATENT DOCUMENTS

2008/0200014 A1*    8/2008    Park et al. ..................... 438/486

* cited by examiner

*Primary Examiner* — Tran Tran
(74) *Attorney, Agent, or Firm* — IP & T Group LLP

(57) ABSTRACT

A phase-change memory device with an improved current characteristic is provided. The phase-change memory device includes a metal word line, a semiconductor layer of a first conductivity type being in contact with the metal word line, and an auxiliary diode layer being in contact with metal word line and the semiconductor layer.

3 Claims, 5 Drawing Sheets

PHASE-CHANGE MEMORY DEVICE HAVING MULTIPLE DIODES

CROSS-REFERENCES TO RELATED APPLICATION

This application is a division of U.S. patent application Ser. No. 13/753,610 filed on Jan. 30, 2013, which is a division of U.S. patent application Ser. No. 12/976,676 filed Dec. 22, 2010, now U.S. Pat. No. 8,384,057, which all claim priorities of Korean patent application number 10-2010-0064866, filed on Jul. 6, 2010. The disclosure of each of the foregoing applications is incorporated by reference in its entirety.

BACKGROUND OF THE INVENTION

1. Technical Field

The inventive concept relates to a non-volatile semiconductor memory device and, more particularly, to a phase-change memory device having multiple diodes.

2. Related Art

Phase-change memory devices, which are one type of non-volatile semiconductor memory devices, include phase-change materials of which resistances are varied depending on temperature. Typically, a chalcogenide (GST) based material, which is comprised of germanium (Ge), antimony (Sb) and tellurium (Te), is used as the phase-change material. The phase-change material is changed between a crystalline state and an amorphous state depending on the temperature to define a reset state corresponding to a logic "1" and a set state corresponding to a logic "0".

A memory cell of the phase-change memory device may include a variable resistor, which is formed from the phase-change material and connected between a word line and a bit line, and a switching element, which selectively drives the variable resistor.

The word line of the phase-change memory device is formed of a junction region in a semiconductor substrate and a bit line is formed of a distribution line. A diode or a MOS transistor may be used as the switching element.

Herein, it is well-known that the junction type word line has a resistance significantly greater than a distribution type word line. Furthermore, if a plurality of memory cells (that is, the switching elements) are connected to the junction type word line, a word line delay may be significant.

Generally, a word line of a metal distribution type (hereinafter, referred to as a metal word line) which is electrically connected to the junction type word line is further formed on the semiconductor substrate to prevent the word line delay. In this case, the switching element is in electrical contact with the metal word line.

When the diode is used as the switching element and selective epitaxial growth is not formed on the metal word line, the diode is formed of a polysilicon layer. As a shottky junction is formed between the polysilicon diode and the metal word line, the polysilicon diode is called a shottky diode.

However, when an etching process is performed to form the shottky diode, an edge of the shottky diode which is in contact with the metal word line may be damaged by an etching gas thereby resulting in a contact fail.

The contact fail between the shottky diode and the metal word line increases an off current and makes an on current difficult to control.

SUMMARY

According to an exemplary embodiment, a phase-change memory device includes a metal word line, a semiconductor layer of a first conductivity type being in electric contact with the metal word line, and an auxiliary diode layer being in contact with the metal word line and the semiconductor layer.

According to another exemplary embodiment, a phase-change memory device includes a semiconductor substrate, a metal word line formed on the semiconductor substrate, a polysilicon layer of a first conductivity type being in contact with an upper portion of the metal word line, and an auxiliary diode layer, disposed on edges of the polysilicon layer to be in contact with the metal word line and the polysilicon layer, and comprising a conduction layer having a different work function from the metal word line.

According to still another exemplary embodiment, a phase-change memory device includes a semiconductor substrate, a metal word line formed on the semiconductor substrate, a polysilicon layer of a first conductivity type being in contact with an upper portion of the metal word line, and an auxiliary diode layer formed on lower edge areas of the polysilicon layer to be in electrical contact with the metal word line and having a second conductivity type opposite to the first conductivity type.

According to still another exemplary embodiment, a phase-change memory device includes a semiconductor substrate, a polysilicon layer of a first conductivity type formed on the semiconductor substrate, a metal word line formed on the polysilicon layer, and an auxiliary diode layer, disposed on edges of the polysilicon layer to be in contact with the metal word line and the polysilicon layer, and comprising a conduction layer having a different work function from the metal word line.

These and other features, aspects, and embodiments are described below in the section entitled "DESCRIPTION OF EXEMPLARY EMBODIMENTS".

BRIEF DESCRIPTION OF THE DRAWINGS

The above and other aspects, features and advantages of the subject matter of the present disclosure will be more clearly understood from the following detailed description and the accompanying drawings, in which.

DESCRIPTION OF EXEMPLARY EMBODIMENTS

Figure 1:
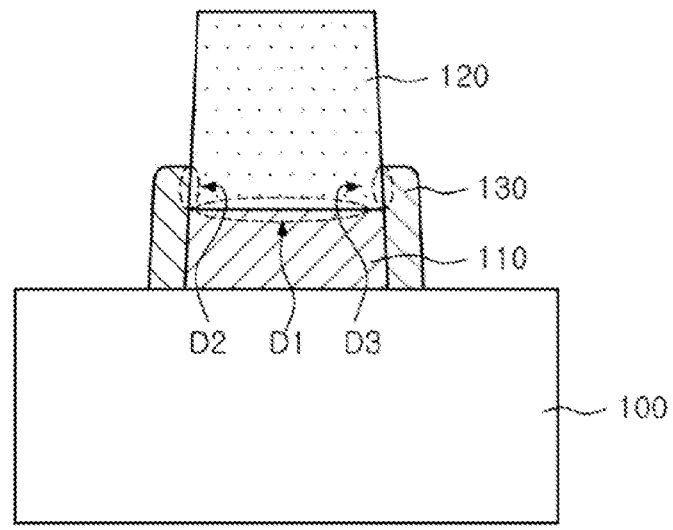
FIG. 1 is a cross-sectional view of a phase-change memory device according to an exemplary embodiment of the inventive concept.

Exemplary embodiments are described herein with reference to the accompanying drawings. One of ordinary skill in the art should understand that variations from the shapes of the illustrations as a result, for example, of manufacturing techniques and/or tolerances, are to be expected. Thus, exemplary embodiments should not be construed as limited to the particular shapes of regions illustrated herein. In the drawings, lengths and sizes of layers and regions may be exaggerated for clarity. Like reference numerals in the drawings denote like elements. Herein, it should also be understood that when a layer is referred to as being "on" another layer or substrate, it can be directly on the other layer or substrate, or intervening layers may also be present.

FIG. 1 is a cross-sectional view of a phase-change memory device according to an exemplary embodiment of the inventive concept.

Referring to FIG. 1, a word line 110, formed of a metal material, is form on a semiconductor substrate 100. The word line 110 is a metal word line 110, which is electrically connected to a junction type word line (not shown) formed in the semiconductor substrate 100. A shottky diode D1 is formed by forming a polysilicon layer 120, including a first conductivity type impurity, on the word line 110. The shottky diode D1 may be formed by depositing the polysilicon layer 120 on the semiconductor substrate 100 and patterning the polysilicon layer 120. The primary shottky junction of the shottky diode D1 may be formed at an interface between the word line 110 and the polysilicon layer 120 constituting the shottky diode D1.

An auxiliary diode layer 130 is formed at edges of an interface between the polysilicon layer 120 and the word line 110.

For example, the auxiliary diode layer 130 may be formed to cover exposed portions of the interface between the polysilicon layer 120 and the word line 110. Preferably, the auxiliary diode layer 130 may be formed on sidewalls of the word line 110 and the polysilicon layer 120 to form a spacer.

By forming the auxiliary diode layer 130, an edge lifting of the shottky diode D1 due to an etching process can be prevented. Thus, the auxiliary diode layer 130 plays a role in fixing the polysilicon layer 120 to the word line 110.

In addition, the auxiliary diode layer 130 may be formed of a conduction layer, which has a different work function from a metal material constituting the word line 110, to form auxiliary diodes D2 and D3 connected to the shottky diode D1.

Figure 2:
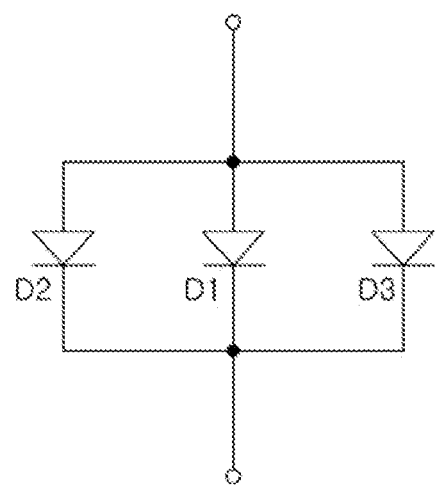
FIG. 2 is an circuit diagram of a unit memory cell of a phase-change memory device according to an exemplary embodiment of the inventive concept.

By forming the auxiliary diodes D2 and D3, a unit memory cell of the phase-change memory device has a switching structure in which the shottky diode D1 and the auxiliary diodes D2 and D3 are connected in parallel as illustrated in FIG. 2. Therefore, one unit memory cell has multiple diodes.

In general, as the shottky diode D1 has a work function relatively lower than a silicon-based PN diode, it is advantageous in terms of an "on" current. On the other hand, the shottky diode D1 is disadvantageous in terms of an "off" current as compared with the PN diode due to a work function of the metal and an adhesion characteristic of the polysilicon layer 120. However, the shottky diode D1 is fixed to the word line 110 by the auxiliary diodes D2 and D3, and thus, the "off" current may be reduced.

Figure 3:
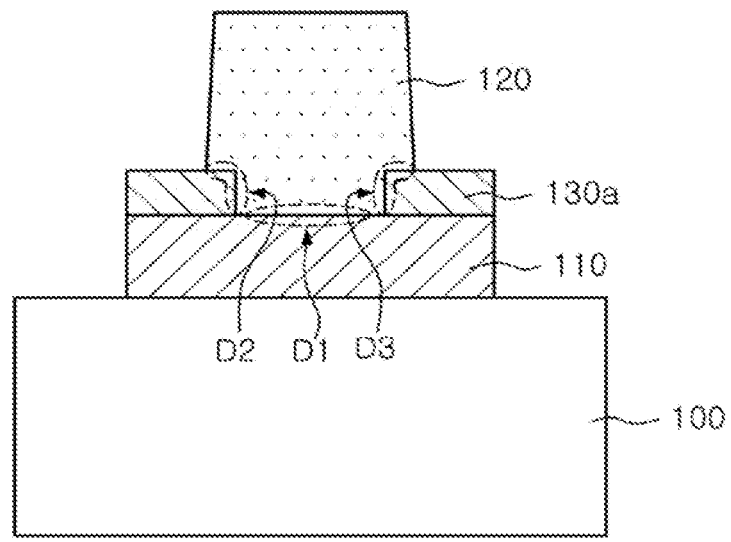
FIGS. 3 to 10 are cross-sectional views of phase-change memory devices according to other exemplary embodiments of the inventive concept.

Alternatively, as illustrated in FIG. 3, an auxiliary diode layer 130a may be formed at edges of a word line 110, before forming a polysilicon layer 120. The polysilicon layer 120 constituting the shottky diode D1 may have substantial interfaces with the auxiliary diode layer 130a in order to construct the auxiliary diodes D2 and D3 in addition to the shottky diode D1 formed at the interface of the polysilicon layer 120 and the word line 110.

Figure 4:
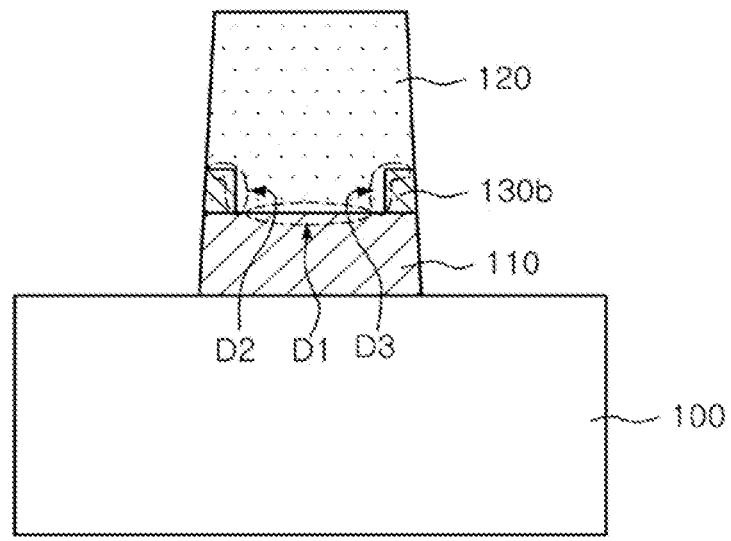

At this time, both edges of the auxiliary diode layer 130a may outwardly protrude from sides of the polysilicon layer 120 as illustrated in FIG. 3, or an auxiliary diode layer 130b may have the same edges as edges of a shottky diode 120 as illustrated in FIG. 4.

The auxiliary diode layer 130a may utilize the same pattern as the word line 110 to have the same profile as the edge of the word line 110 as illustrated in FIG. 3. Alternatively, the auxiliary diode layer 130b may utilize the same pattern as the polysilicon layer 120 to have the same profile as an edge of the polysilicon layer 120 as illustrated in FIG. 4.

Figure 5:
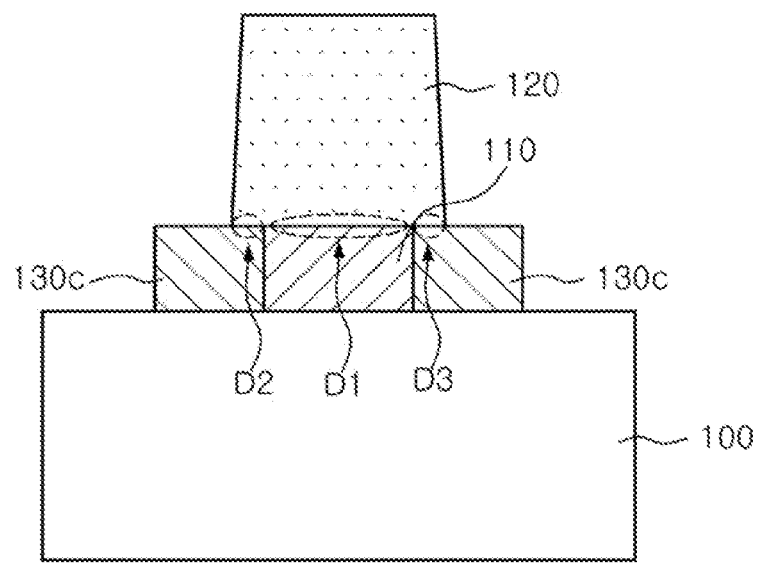

Furthermore, as illustrated in FIG. 5, an auxiliary diode layer 130c may be formed on side surfaces of a word line 110.

In this case, the polysilicon layer 120 is formed to cover portions of the auxiliary diode layer 130c in addition to covering the word line 110. Accordingly, a shottky diode D1 is formed at the interface of the word line 110 and the polysilicon layer 120, while auxiliary diodes D2 and D3 are formed at the interfaces of the auxiliary diode layer 130c and the polysilicon layer 120 on both sides of the shottky diode D1. After the word line 110 is formed, the auxiliary diode layer 130c may be deposited and then isotropically etched to have the above structure.

Figure 6:
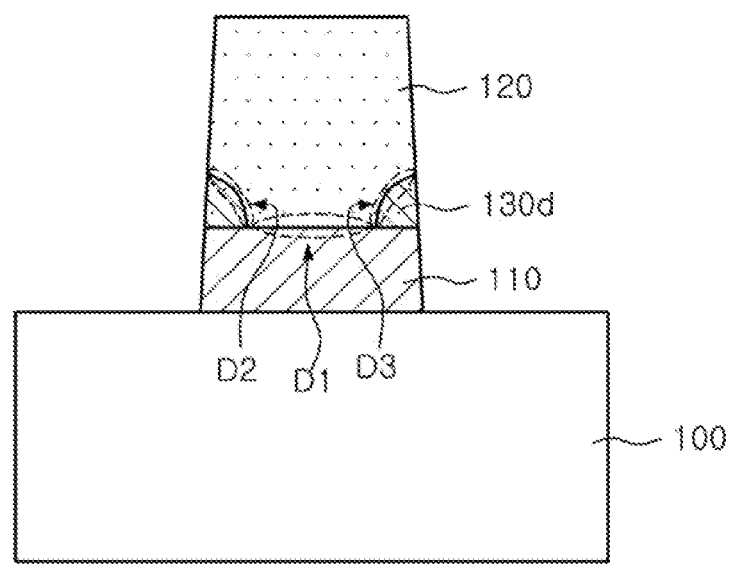

Referring to FIG. 6, an auxiliary diode layer 130d may be formed within the polysilicon layer 120. The auxiliary diode layer 130d may be formed of a polysilicon layer having a second conductivity type opposite to the first conductivity type of the polysilicon layer 120. In particular, the auxiliary diode layer 130d may be formed in lower edges of the polysilicon layer 120. The auxiliary diode layer 130d may be formed by obliquely ion implanting an impurity in the lower edges of the polysilicon layer 120.

Herein, if the polysilicon layer 120 has a P type impurity, the work function of the shottky diode D1 is smaller than that of the auxiliary diodes D2 or D3. On the other hand, if the polysilicon layer has an N type impurity, the work function of the shottky diode D1 is larger than that of the auxiliary diodes D2 or D3.

Although the exemplary embodiments described above dispose the word line 110 below the polysilicon layer 120, the word line 110 may be disposed over the polysilicon layer 120 to form the shottky diode D1.

Figure 7:
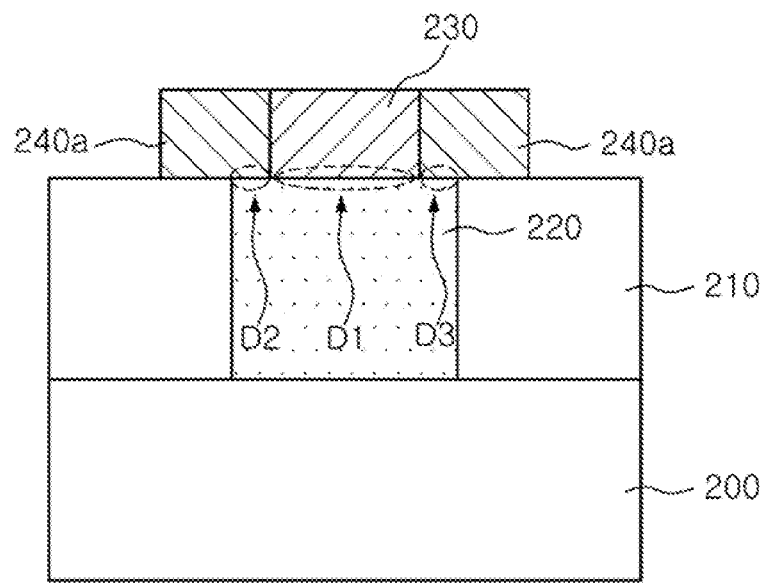

As illustrated in FIG. 7, a word line 230 and an auxiliary diode layer 240a may be formed on a polysilicon layer 220. The polysilicon layer 220 may be disposed in an interlayer insulating layer 210 formed on a semiconductor substrate 200. In FIG. 7, the auxiliary diode layer 240a is disposed on both sidewalls of the word line 230 so that interfaces of the polysilicon layer 220 and the auxiliary diode layer 240a may be formed at both sides of the interface of the polysilicon layer 220 and the word line 230. Accordingly, the interface of the polysilicon layer 220 and the word line 230 forms the shottky diode D1 while the interfaces of the auxiliary diode layer 240a and the polysilicon layer 220 form the auxiliary diodes D2 and D3.

Figure 8:
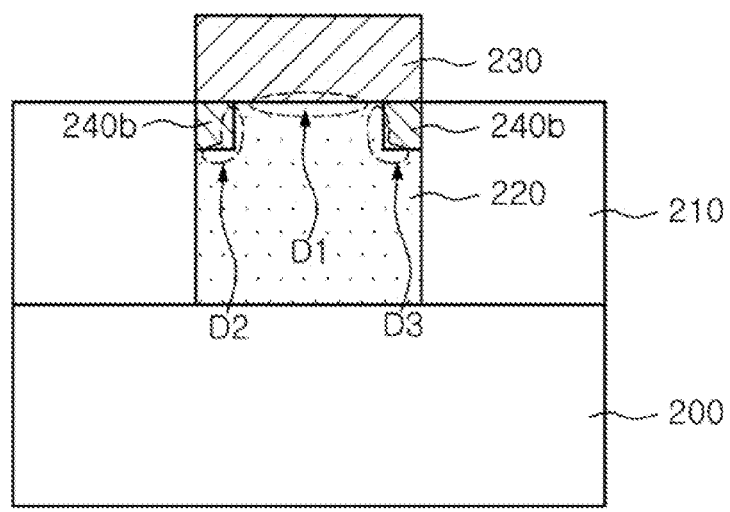

Alternatively, as illustrated in FIG. 8, an auxiliary diode layer 240b may be formed within upper edge areas of the polysilicon layer 220. The auxiliary diode layer 240b may be formed by selectively ion implanting a second conductivity type impurity in the upper edge areas of the polysilicon layer 220 having a first conductivity type impurity. Alternatively, the auxiliary diode layer 240b may be formed by etching the upper edge areas of the polysilicon layer 220 to form grooves (not shown) and filling the grooves with a conduction layer having a different work function than that of the word line 230.

Figure 9:
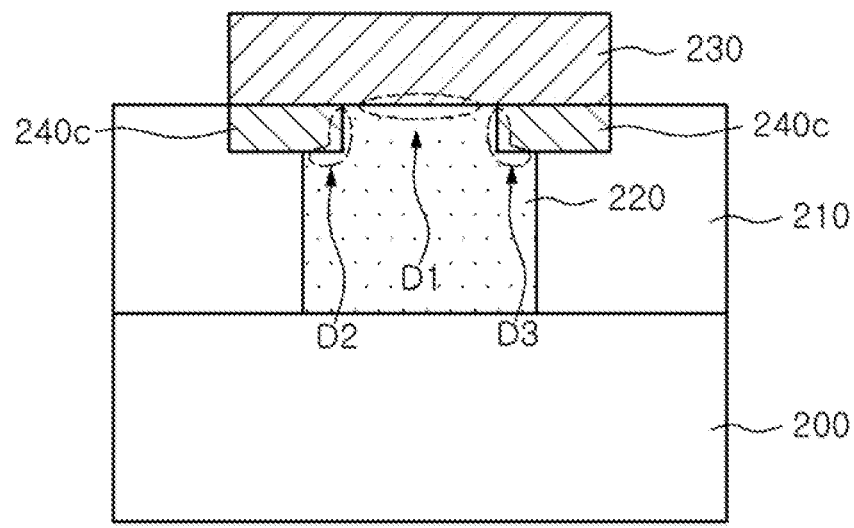

Although the auxiliary diode layer 240b of FIG. 8 is formed to have the same outer sidewalls as outer sidewalls of the polysilicon layer 220, in another exemplary embodiment an auxiliary diode layer 240c may be formed such that outer sidewalls of the auxiliary diode layer 240c may be further extended into an interlayer insulating layer 210, as illustrated in FIG. 9.

Figure 10:
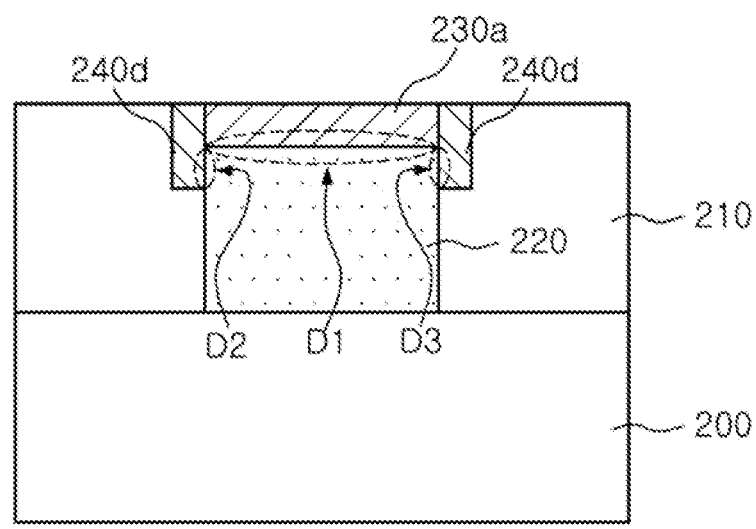

In yet another exemplary embodiment, as illustrated in FIG. 10, a word line 230a may be formed on a polysilicon layer 220 such that an upper surface of the word line 230a is level with an upper surface of an interlayer insulating layer 210. In this case, an auxiliary diode layer 240d may be formed on side ails of the polysilicon layer 220 and the word line 230a.

According to the inventive concept of the present application, an auxiliary diode layer, which is formed from a conduction material having a different work function than a word line, is further formed at or around a shottky diode.

Furthermore, the auxiliary diode layer is in contact with the word line as well as the polysilicon layer including the shottky diode to serve as a fixing element such that an edge lifting of the shottky diode can be reduced in order to reduce an "off" current.

As a result, a plurality of diodes are connected in parallel in a unit memory cell of a phase-change memory device. Moreover, the plurality of diodes can have various threshold voltages. Accordingly, when a main shottky diode of a corresponding unit memory cell is turned on, the auxiliary diode, having a larger threshold voltage, serves as an electric barrier because of its difference in threshold voltage.

While the present invention has been described with respect to the specific embodiments, it will be apparent to those skilled in the art that various changes and modifications may be made without departing from the spirit and scope of the invention as defined in the following claims.

What is claimed is:

1. A phase-change memory device, comprising:
   a semiconductor substrate;
   a metal word line formed on the semiconductor substrate;
   a polysilicon layer of a first conductivity type being in contact with an upper portion of the metal word line; and
   an auxiliary diode layer formed laterally and directly adjacent to outer sidewalls of the polysilicon layer to be in electrical contact with the metal word line and having a second conductivity type opposite to the first conductivity type.

2. A phase-change memory device, comprising:
   a semiconductor substrate;
   a metal word line formed on the semiconductor substrate;
   a polysilicon layer of a first conductivity type being in contact with an upper portion of the metal word line; and
   an auxiliary diode layer formed laterally and directly adjacent to outer sidewalls of the metal word line to be in electrical contact with the polysilicon layer and having a second conductivity type opposite to the first conductivity type.

3. A phase-change memory device, comprising:
   a semiconductor substrate;
   a metal word line formed on the semiconductor substrate;
   a polysilicon layer of a first conductivity type being in contact with an upper portion of the metal word line; and
   an auxiliary diode layer formed laterally and directly adjacent to outer sidewalls of the metal word line and the polysilicon layer and having a second conductivity type opposite to the first conductivity type.

* * * * *